United States Patent
Camacho et al.

(10) Patent No.: US 8,072,047 B2
(45) Date of Patent: Dec. 6, 2011

(54) INTEGRATED CIRCUIT PACKAGE SYSTEM WITH SHIELD AND TIE BAR

(75) Inventors: Zigmund Ramirez Camacho, Singapore (SG); Lionel Chien Hui Tay, Singapore (SG); Henry Descalzo Bathan, Singapore (SG); Guruprasad Badakere Govindaiah, Singapore (SG)

(73) Assignee: Stats Chippac Ltd., Singapore (SG)

( * ) Notice: Subject to any disclaimer, the term of this patent is extended or adjusted under 35 U.S.C. 154(b) by 484 days.

(21) Appl. No.: 12/124,793

(22) Filed: May 21, 2008

(65) Prior Publication Data

US 2009/0289335 A1    Nov. 26, 2009

(51) Int. Cl.
*H01L 23/552* (2006.01)
*H01L 21/56* (2006.01)

(52) U.S. Cl. ........ 257/659; 257/422; 257/660; 257/718; 257/723; 257/728; 257/732; 257/E23.051; 174/50.59; 361/800; 361/816; 361/818

(58) Field of Classification Search .......... 257/422, 257/659, 660, 718, 723, 728, 732, E23.051; 361/800, 816, 818; 174/50.59
See application file for complete search history.

(56) References Cited

U.S. PATENT DOCUMENTS

| | | | |
|---|---|---|---|
| 5,173,764 A | 12/1992 | Higgins, III | |
| 5,299,097 A | 3/1994 | Kondo et al. | |
| 5,485,037 A | 1/1996 | Marrs | |
| 5,559,306 A | 9/1996 | Mahulikar | |
| 5,650,659 A | 7/1997 | Mostafazadeh et al. | |
| 5,703,398 A * | 12/1997 | Sono et al. | 257/706 |
| 6,093,957 A | 7/2000 | Kwon | |
| 6,614,102 B1 * | 9/2003 | Hoffman et al. | 257/666 |
| 6,847,099 B1 | 1/2005 | Bancod et al. | |
| 6,867,071 B1 | 3/2005 | Lee et al. | |
| 6,951,776 B2 | 10/2005 | Lo et al. | |
| 2002/0030266 A1 | 3/2002 | Murata | |
| 2005/0125568 A1 | 6/2005 | Yeo et al. | |
| 2006/0103009 A1 | 5/2006 | Lee et al. | |
| 2006/0166397 A1 * | 7/2006 | Lau et al. | 438/106 |
| 2007/0063322 A1 | 3/2007 | Chow et al. | |
| 2007/0090502 A1 * | 4/2007 | Zhao et al. | 257/675 |
| 2007/0164409 A1 | 7/2007 | Holland | |
| 2008/0006926 A1 | 1/2008 | Bathan et al. | |
| 2008/0111217 A1 * | 5/2008 | Dimaano et al. | 257/675 |
| 2009/0166845 A1 * | 7/2009 | Camacho et al. | 257/696 |

FOREIGN PATENT DOCUMENTS

WO    WO9727627 A1    7/1997

* cited by examiner

*Primary Examiner* — Eugene Lee
*Assistant Examiner* — Peniel M Gumedzoe
(74) *Attorney, Agent, or Firm* — Mikio Ishimaru

(57) ABSTRACT

An integrated circuit package system includes: providing a tie bar and a lead adjacent thereto; connecting an integrated circuit and the lead; mounting a shield over the integrated circuit with the shield connected to the tie bar; and encapsulating the integrated circuit and the shield. An integrated circuit package system also includes: forming a lead and a support structure with substantially the same material as the lead and elevated above the lead; connecting an integrated circuit and the lead; mounting a shield over the integrated circuit with the shield on the support structure; and encapsulating the integrated circuit and the shield.

20 Claims, 14 Drawing Sheets

INTEGRATED CIRCUIT PACKAGE SYSTEM WITH SHIELD AND TIE BAR

CROSS-REFERENCE TO RELATED APPLICATION(S)

The present application contains subject matter related to co-pending U.S. patent application Ser. No. 11/965,550 filed Dec. 27, 2007. The related application is assigned to STATS ChipPAC Ltd. and the subject matter thereof is incorporated herein by reference thereto.

TECHNICAL FIELD

The present invention relates generally to integrated circuit package system and more particularly to an integrated circuit package system having a shield.

BACKGROUND ART

Modern electronic devices, for example cellular phones, personal audio/video players, hand held video games, and global positioning systems, require a seamless integration of analog and digital subsystems. Furthermore, premiums are often placed on small size, complexity, and high performance. Thus, highly sensitive analog circuits frequently need to be placed very close to high-speed digital systems.

High-speed digital systems can switch at more than one billion times a second. At such switching speeds, switching currents tend to be high. Thus, such high-speed digital systems can radiate energy that interferes with highly sensitive analog circuits. Interference usually takes the form of signal crosstalk. While faraday shielding has been widely used to protect highly sensitive analog circuits from interference, the traditional faraday shields tend to be expensive in both space and labor content. Furthermore, their implementation must be undertaken with great foresight to determine where to install the shields, and with great care to actually protect the analog circuits. Moreover, the traditional faraday shield is not particularly flexible.

Traditionally, an integrated circuit is supplied as part of a semiconductor package having external leads for soldering, or otherwise connecting, to a printed circuit board. For example, surface mount leadless packages have been widely used with integrated circuit chips. In such packages, an integrated circuit chip is encapsulated in a ceramic or plastic housing having electrical leads that are suitable for soldering to a circuit board. Bonding conductors, which are also encapsulated in the housing, extend from the upper part of the electrical leads, which are within the package, to electrical pads on the integrated circuit chip.

A typical semiconductor package includes a lead frame, which is usually stamped out of a metal strip. The lead frame may include a plurality of leads held together by connectors that extend between the leads. The lead frame may further include a mounting pad.

Typically, the bond conductors are welded to the electrical leads and to the electrical pads. Next the lead frame, the integrated circuit chip, and the bonding conductors are then encapsulated. Finally the leads are cut and formed as required to complete the semiconductor package.

Because of the demand for high-density packaging, surface mount leadless packages have become popular. However, denser packaging increases the cross-talk problem. Furthermore, many analog circuits have a high impedance level that makes them particularly sensitive to crosstalk. So, while useful, most surface mount leadless packages provide inadequate electrical and electromagnetic isolation of their components.

Another type of semiconductor package, one that is a hybrid of the surface mount leadless package and a "pin-type" package, is possible. Such a semiconductor package has "pins" that extend from the bottom of the package. Those pins are designed to attach to pads on the surface of a printed circuit board. As electrical connections are not made along the edges of the package, adjacent semiconductor packages can abut, which allows dense packaging. While beneficial, this also increases the cross-talk problem.

Thus, a need still remains for integrated circuit package system that provides electromagnetic isolation of a component mounted therein. More beneficial would be a low cost semiconductor package that enables dense packaging of integrated circuit chips, together with electromagnetic isolation of those chips. In view of the increasing demand for small and highly integrated electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a tie bar and a lead adjacent thereto; connecting an integrated circuit and the lead; mounting a shield over the integrated circuit with the shield connected to the tie bar; and encapsulating the integrated circuit and the shield.

The present invention also provides an integrated circuit package system including: forming a lead and a support structure with substantially the same material as the lead and elevated above the lead; connecting an integrated circuit and the lead; mounting a shield over the integrated circuit with the shield on the support structure; and encapsulating the integrated circuit and the shield.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
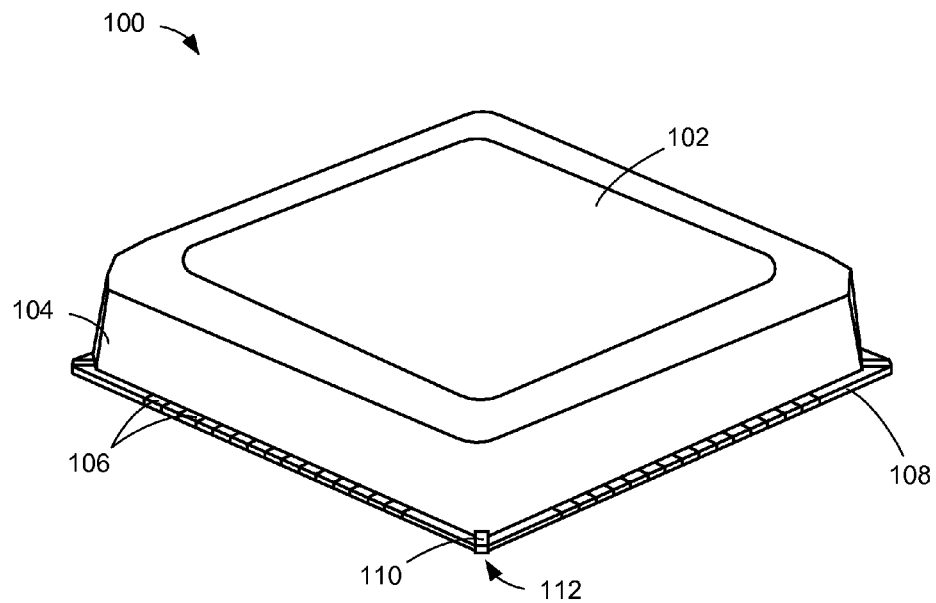
FIG. 1 is an isometric top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown an isometric top view of an integrated circuit package system 100 in a first embodiment of the present invention. The top view depicts a shield 102, such as an electromagnetic interference (EMI) shield, surrounded by an encapsulation 104, such as a cover including an epoxy molding compound. Leads 106 can be exposed from the encapsulation 104 at sides 108 of the integrated circuit package system 100. Corner terminals 110, such as leads, can be exposed from the encapsulation 104 at corners 112 of the integrated circuit package system 100.

For illustrative purposes, the integrated circuit package system 100 are shown with the leads 106 equally distributed along each of the sides 108, although it is understood that the integrated circuit package system 100 can have the leads 106 in a different configuration. For example, the number of the leads 106 can be different between the sides 108 of the integrated circuit package system 100.

Also for illustrative purposes, the integrated circuit package system 100 is shown with the corner terminals 110 along each of the corners 112, although it is understood that the integrated circuit package system 100 can have the corner terminals 110 in a different configuration. For example, the number of the corner terminals 110 may not populate each of the corners 112 of the integrated circuit package system 100.

Further for illustrative purposes, the integrated circuit package system 100 is shown with the shield 102 exposed by the encapsulation 104, although it is understood that the integrated circuit package system 100 can have the shield in a different configuration. For example, the integrated circuit package system 100 may not expose the shield 102 from the encapsulation 104.

Figure 2:
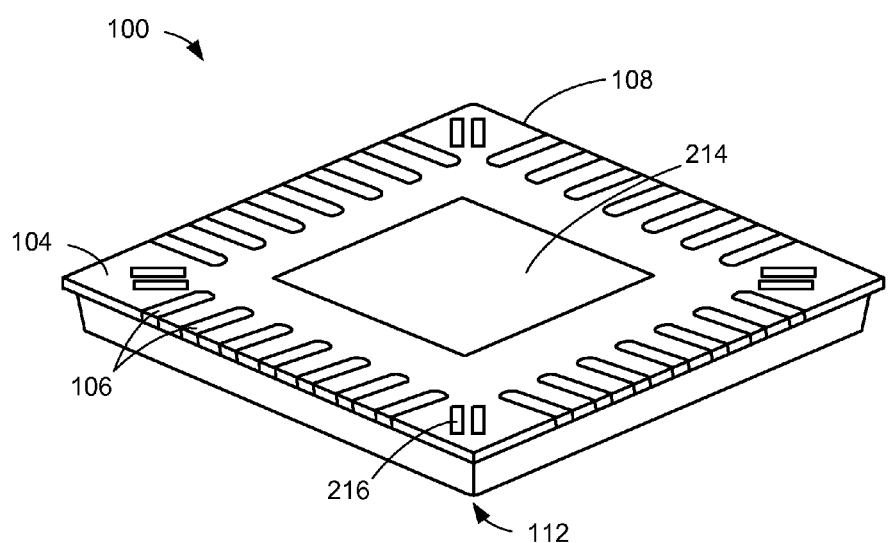
FIG. 2 is an isometric bottom view of the integrated circuit package system.

Referring now to FIG. 2, therein is shown an isometric bottom view of the integrated circuit package system 100. The bottom view depicts a paddle 214, such as a die-attach paddle, surrounded by the encapsulation 104. The leads 106 can be along the edges of the paddle 214 and along the sides 108 of the integrated circuit package system 100. Shield bases 216 can be optionally shown at the corners 112 of the integrated circuit package system 100. The shield bases 216 are part of the shield 102 of FIG. 1. A bottom surface of the shield bases 216 are coplanar to a bottom surface of the leads 106 that is opposite to the shield 102.

For illustrative purposes, the integrated circuit package system 100 is shown with the shield bases 216 along each of the corners 112, although it is understood that the integrated circuit package system 100 can have the shield bases 216 in a different configuration. For example, the number of the shield bases 216 may not populate each of the corners 112 of the integrated circuit package system 100.

Figure 3:
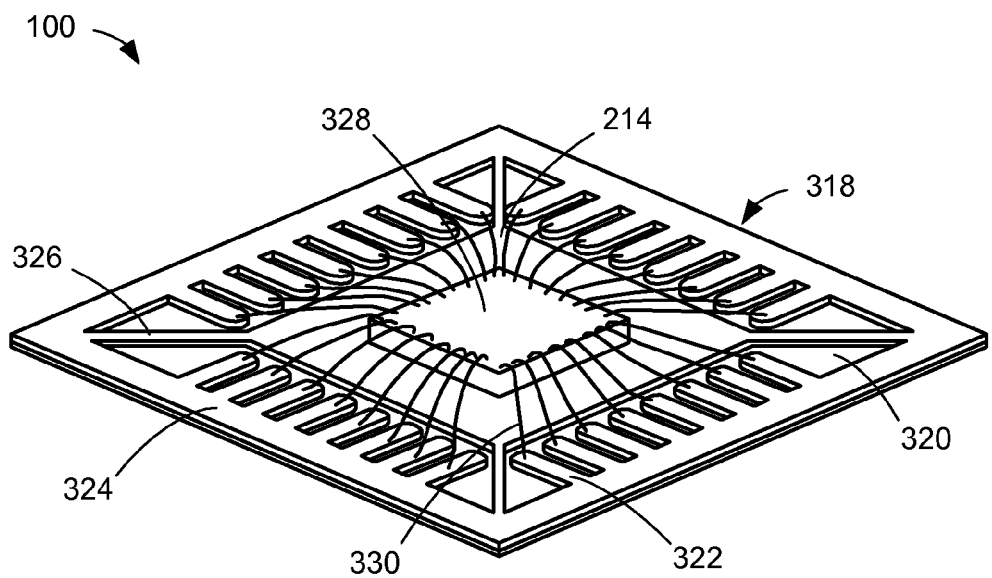
FIG. 3 is an isometric view of the integrated circuit package system of FIG. 1 in a die-attaching step.

Referring now to FIG. 3, therein is shown an isometric view of the integrated circuit package system 100 of FIG. 1 in a die-attaching step. The isometric view depicts a lead frame 318 attached to a tape 320, such as a coverlay tape. Side terminals 322 can extend from dam bars 324 of the lead frame 318 and towards the paddle 214. Tie bars 326 can be between the corners of the lead frame 318 and the paddle 214. An integrated circuit 328, such as an integrated circuit die, mounts over the paddle 214. Internal interconnects 330, such as bond wires or ribbon bond wires, connect the integrated circuit 328 and a predetermined selection of the side terminals 322.

Figure 4:
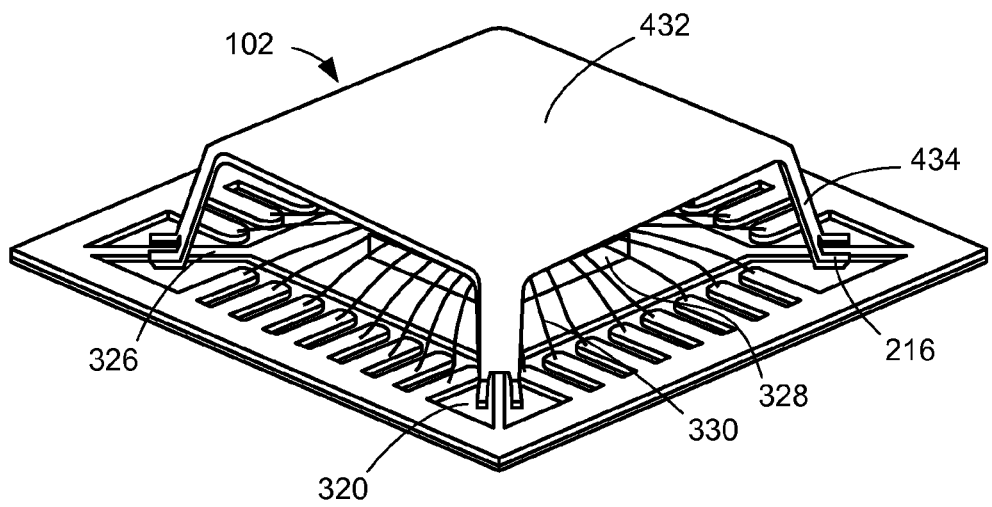
FIG. 4 is the structure of FIG. 3 in a mounting step of the shield.

Referring now to FIG. 4, therein is shown the structure of FIG. 3 in a mounting step of the shield 102. The shield 102 includes a central portion 432 and supports 434 extending from corners of the central portion 432. The supports 434 include the shield bases 216. The shield 102 mounts over the integrated circuit 328 with the shield bases 216 over the tape 320 and the tie bars 326 between the shield bases 216. The central portion 432 does not perturb the internal interconnects 330.

Figure 5:
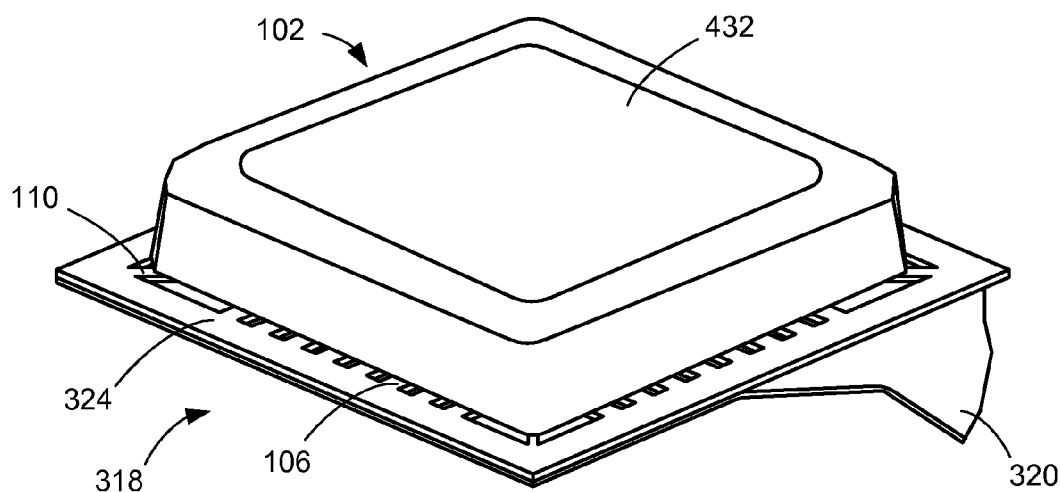
FIG. 5 is the structure of FIG. 4 in a removal step of the tape.

Referring now to FIG. 5, therein is shown the structure of FIG. 4 in a removal step of the tape 320. The encapsulation 104 is formed over the structure of FIG. 4 covering the integrated circuit 328 of FIG. 4 and the internal interconnects 330 of FIG. 4. The encapsulation 104 is shown exposing the central portion 432. The tape 320 is shown being peeled away from the lead frame 318. The structure preferably undergoes a singulation process removing the dam bars 324 and forming the integrated circuit package system 100 of FIG. 1. The leads 106 can be formed from the side terminals 322 of FIG. 3 and the corner terminals 110 can be formed from the tie bars 326 of FIG. 4.

Figure 6:
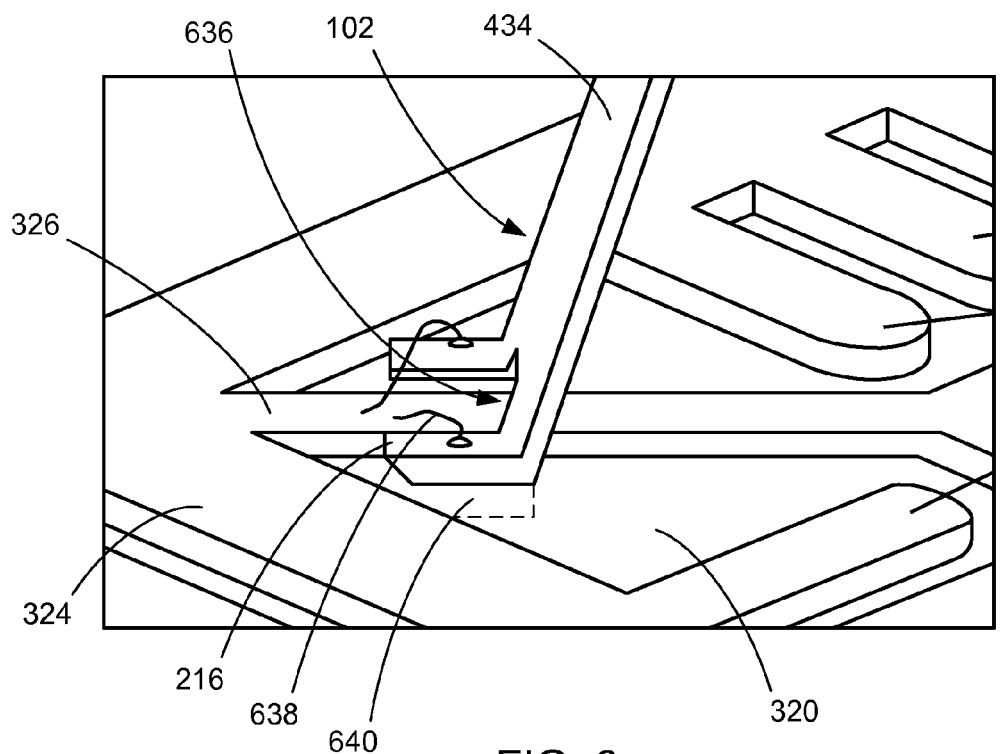
FIG. 6 is a more detailed isometric view of a portion of the integrated circuit package system of FIG. 4.

Referring now to FIG. 6, therein is shown a more detailed isometric view of a portion of the integrated circuit package system 100 of FIG. 4. The more detailed isometric view depicts a corner portion of the structure of FIG. 4 depicting one of the tie bars 326 between the paddle 214 of FIG. 2 and the dam bars 324. One of the supports 434 is shown over the tape 320. One of the tie bars 326 is shown between the shield bases 216. The shield bases 216 can include a gap 636 with the other portion of the supports 434.

The shield bases 216, the supports 434, or a combination thereof can contact the tie bars 326. If the tie bars 326 are grounded, then the shield 102 is also ground such that the shield 102 can function as an EMI shield. The gap 636 can be small enough that the portion of the supports adjacent to the shield bases 216 can contact the tie bars 326. Alternatively, shielding interconnects 638, such as bond wires or conductive paste, can connect the tie bars 326 with the shield bases 216 or other portions of the supports 434.

The shield bases 216 can optionally includes a coating 640, such as an epoxy pre-coating, as depicted by dotted lines between the shield bases 216 and the tape 320. The coating 640 would not expose the shield bases 216 from the encapsulation 104 of FIG. 2. Without the coating 640, the shield 102 can be grounded by connecting the shield bases 216 with a ground connection at the next system level (now shown), such as a printed circuit board or another integrated circuit package system.

Figure 7:
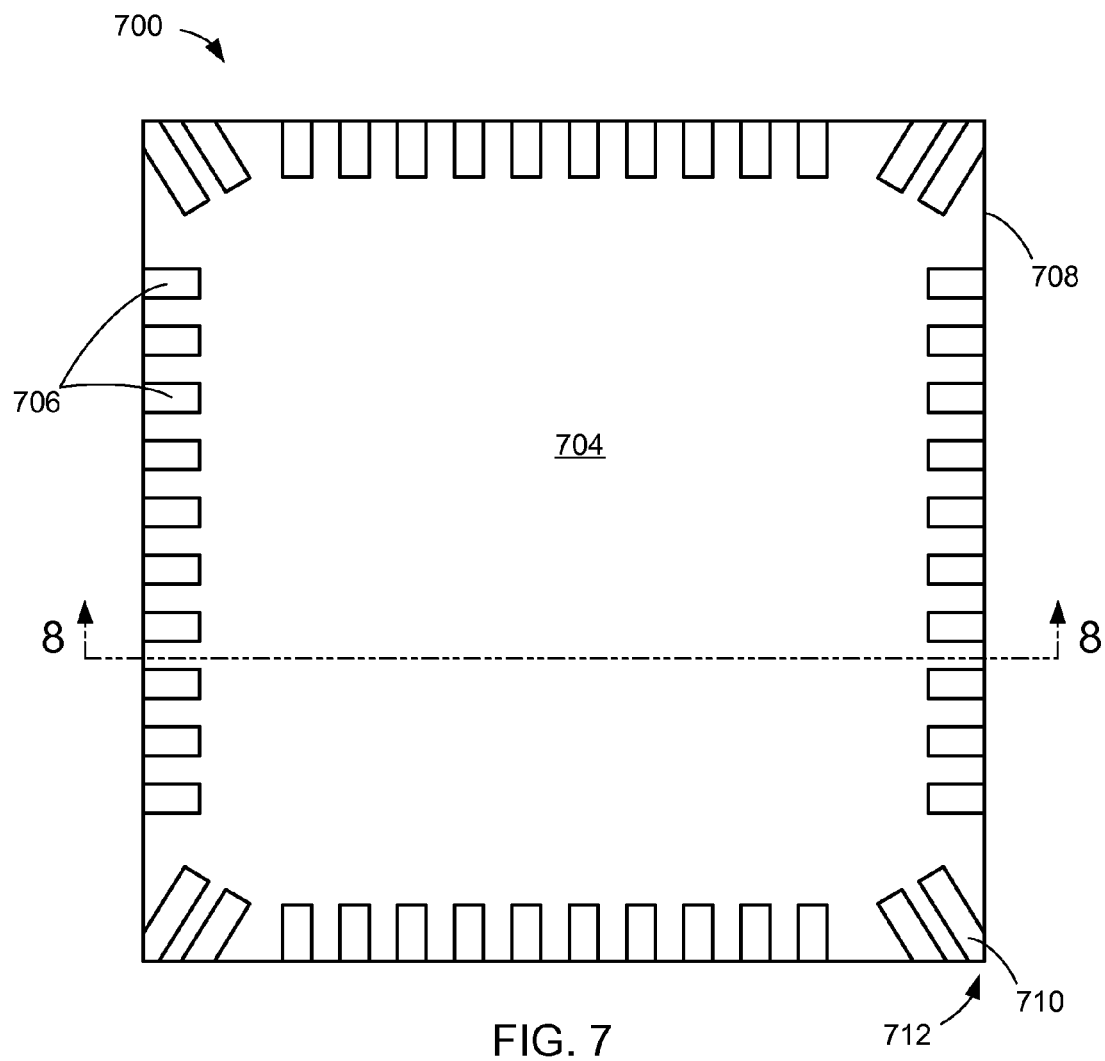
FIG. 7 is a top view of an integrated circuit package system in a second embodiment of the present invention.

Referring now to FIG. 7, therein is shown a top view of an integrated circuit package system 700 in a second embodiment of the present invention. The top view depicts an encapsulation 704, such as a cover including an epoxy molding compound. Leads 706 can be exposed from the encapsulation 704 at sides 708 of the integrated circuit package system 700. Corner terminals 710, such as leads, can be exposed from the encapsulation 704 at corners 712 of the integrated circuit package system 700.

Figure 8:
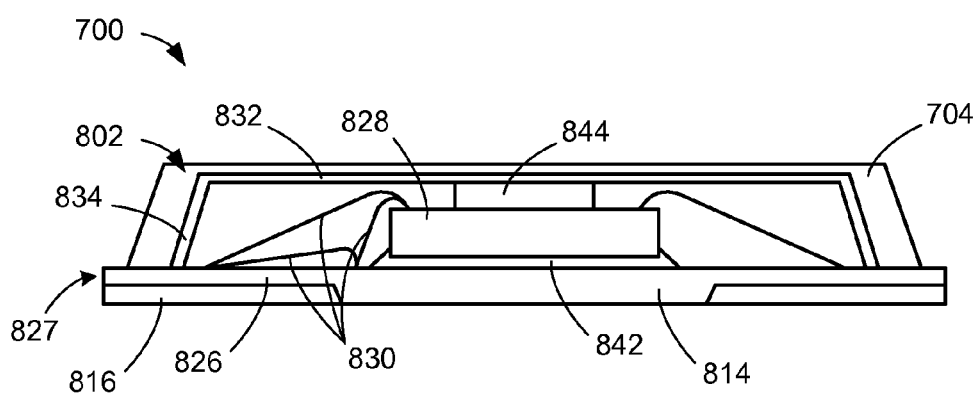
FIG. 8 is a cross-sectional view of the integrated circuit package system along line 8-8 of FIG. 7.

Referring now to FIG. 8, therein is shown a cross-sectional view of the integrated circuit package system 700 along line 8-8 of FIG. 7. The cross-sectional view depicts an integrated circuit 828, such as an integrated circuit die, mounted over a paddle 814, such as a die-attach paddle, with an adhesive 842, such as a die-attach adhesive. Tie bars 826 can extend from the paddle 814. Corner leads 827 are exposed portions of the tie bars 826.

Internal interconnects 830, such as bond wires or ribbon bond wires, can connect the integrated circuit 828 with the tie bars 826, the leads 706 of FIG. 7, or a combination thereof. A spacer 844, such as an adhesive spacer or a film adhesive, is between the integrated circuit 828 and a shield 802. The spacer 844 can function to provide clearance for the wire loops of the internal interconnects 830 from the shield 802 preventing damage to the internal interconnects 830. The shield 802 is mounted into the tie bars 826 and over the spacer 844, the integrated circuit 828, and the internal interconnects 830.

The shield 802 includes a central portion 832 and supports 834 extending from the central portion 832. The supports 834 includes shield bases 816 that includes a resilient spring like properties that allows the shield bases 816 to fit, mate, and interlock with the tie bars 826. The shield bases 816 extend below the tie bars 826.

The encapsulation 704 can be over the integrated circuit 828, the internal interconnects 830, and the shield 802. The encapsulation 704 exposes the paddle 814 and the corner leads 827. For illustrative purposes, the integrated circuit package system 700 is shown with the paddle 814 exposed from the encapsulation 704, although it is understood that the encapsulation 704 may not expose the paddle 814.

Figure 9:
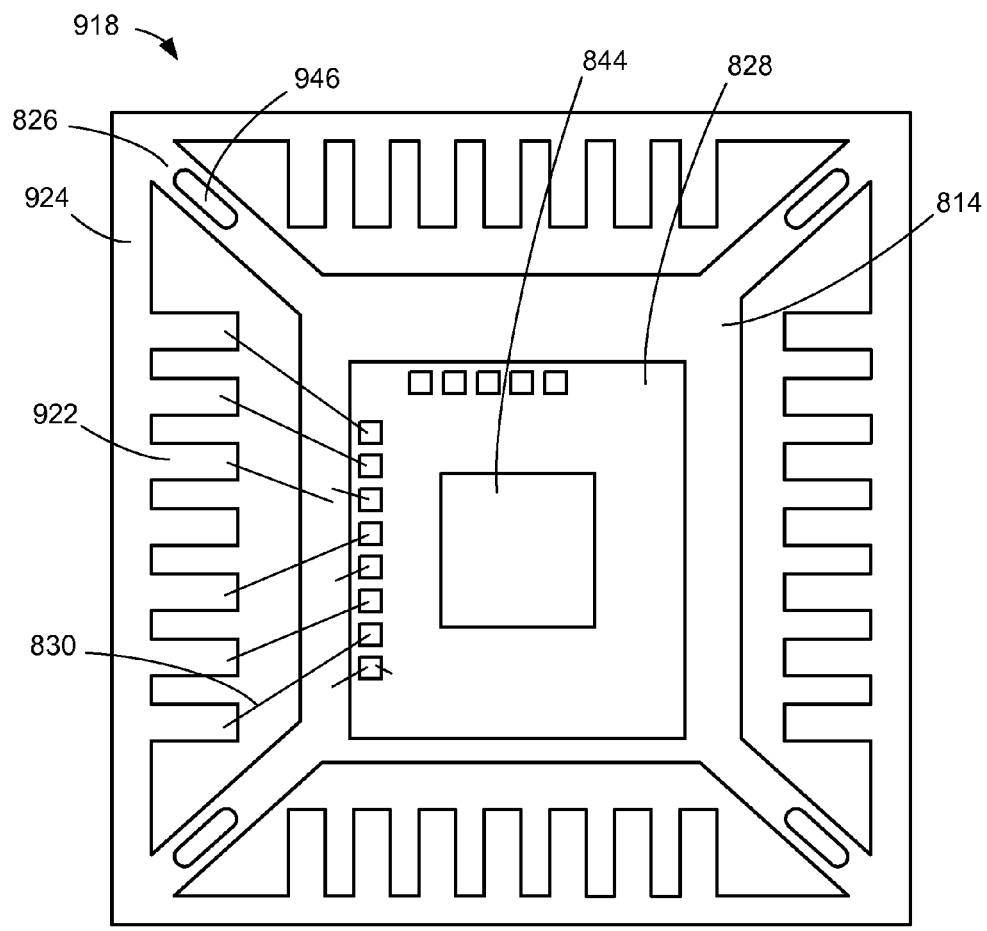
FIG. 9 is a top view of the integrated circuit package system of FIG. 7 in a connecting step of the internal interconnects.

Referring now to FIG. 9, therein is shown a top view of the integrated circuit package system 700 of FIG. 7 in a connecting step of the internal interconnects 830. The top view depicts a lead frame 918. Side terminals 922 can extend from dam bars 924 of the lead frame 918 and towards the paddle 814. The tie bars 826 can be between the corners of the lead frame 918 and the paddle 814. Each of the tie bars 826 can include a slot 946 for interlocking the shield bases 816 of FIG. 8.

The integrated circuit 828 mounts over the paddle 814 and the spacer 844 over the integrated circuit 828. The internal interconnects 830 can connect the integrated circuit 828 and a predetermined selection of the side terminals 922 as well as to the paddle 814. For clarity, not all the internal interconnects 830 are depicted. The side terminals 922 form the leads 706 of FIG. 7 from the processing of the lead frame 918.

Figure 10:
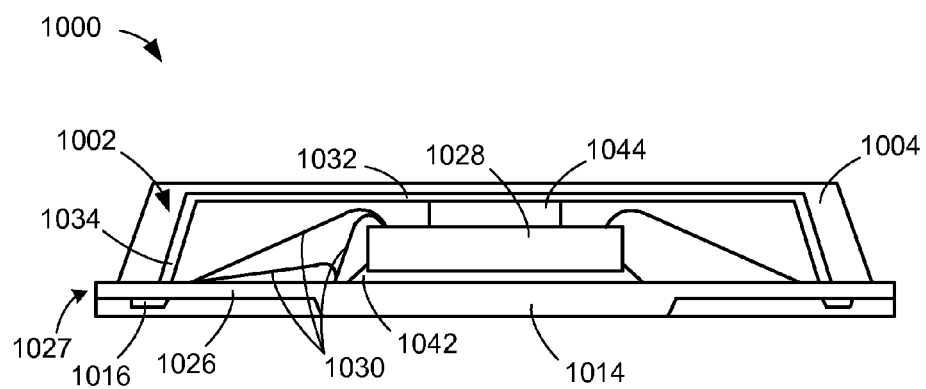
FIG. 10 is a cross-sectional view of an integrated circuit package system as exemplified by the top view of FIG. 7 in a third embodiment of the present invention.

Referring now to FIG. 10, therein is shown a cross-sectional view of an integrated circuit package system 1000 as exemplified by the top view of FIG. 7 in a third embodiment of the present invention. The integrated circuit package system 1000 includes structural similarities with the integrated circuit package system 700 of FIG. 7.

The cross-sectional view depicts an integrated circuit 1028, such as an integrated circuit die, mounted over a paddle 1014, such as a die-attach paddle, with an adhesive 1042, such as a die-attach adhesive. Tie bars 1026 can extend from the paddle 1014. Corner leads 1027 are exposed portions of the tie bars 1026.

Internal interconnects 1030, such as bond wires or ribbon bond wires, can connect the integrated circuit 1028 with the tie bars 1026, the leads 706 of FIG. 7, or a combination thereof. A spacer 1044, such as an adhesive spacer or a film adhesive, is between the integrated circuit 1028 and a shield 1002. The spacer 1044 can function to provide clearance for the wire loops of the internal interconnects 1030 from the shield 1002 preventing damage to the internal interconnects 1030. The shield 1002 is mounted into the tie bars 1026 and over the spacer 1044, the integrated circuit 1028, and the internal interconnects 1030.

The shield 1002 includes a central portion 1032 and supports 1034 extending from the central portion 1032. The supports 1034 include shield bases 1016 in a planar configuration to fit into the tie bars 1026. The shield bases 1016 can snap into and extend below the tie bars 1026.

An encapsulation 1004 can be over the integrated circuit 1028, the internal interconnects 1030, and the shield 1002. The encapsulation 1004 exposes the paddle 1014 and the corner leads 1027. The encapsulation 1004 can optionally expose the shield bases 1016 for connection, such as ground connection, with the next system level (not shown), such as a printed circuit board or another integrated circuit package system. For illustrative purposes, the integrated circuit package system 10000 is shown with the paddle 1014 exposed from the encapsulation 1004, although it is understood that the encapsulation 1004 may not expose the paddle 1014.

Figure 11:
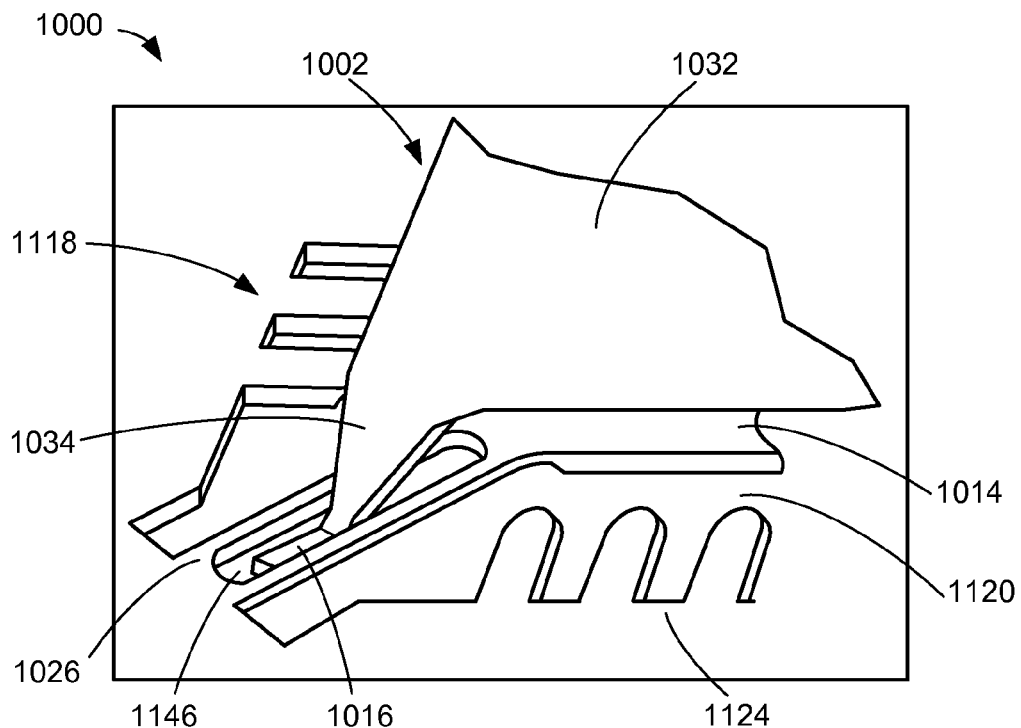
FIG. 11 is a detailed isometric view of a portion of the integrated circuit package system of FIG. 10 in a mounting step of the shield.

Referring now to FIG. 11, therein is shown a detailed isometric view of a portion of the integrated circuit package system 1000 of FIG. 10 in a mounting step of the shield 1002. The detailed isometric view depicts a corner portion of a lead frame 1118 depicting one of the tie bars 1026 between the paddle 1014 and dam bars 1124. One of the supports 1034 is shown over a tape 1120, which is optional.

The supports 1034 can have a tapered configuration with the portion adjacent to the central portion 1032 wider than the portion adjacent to the shield bases 1016. This tapered configuration allows the shield 1002 to be fitted or wedged into a slot 1146 of the tie bars 1026. The shield bases 1016, the supports 1034, or a combination thereof can contact the tie bars 1026. If the tie bars 1026 are grounded, the shield 1002 is also ground such that the shield 1002 can function as an EMI shield.

Figure 12:
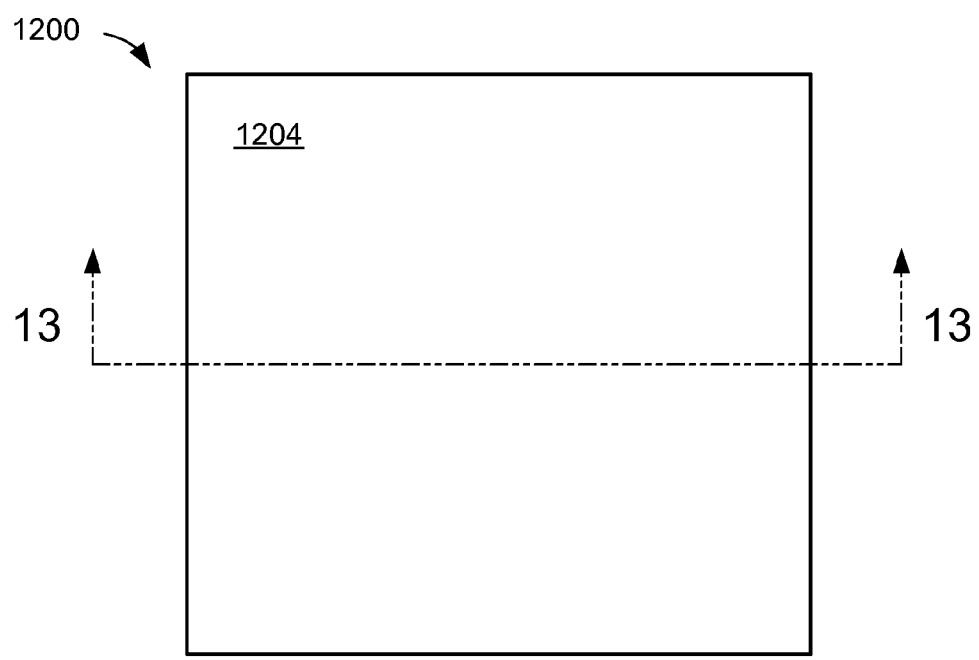
FIG. 12 is a top view of an integrated circuit package system in a fourth embodiment of the present invention.

Referring now to FIG. 12, therein is shown a top view of an integrated circuit package system 1200 in a fourth embodiment of the present invention. The top view depicts an encapsulation 1204, such as a cover including an epoxy molding compound. For illustrative purposes, the integrated circuit package system 1200 is shown with a square configuration, although it is understood that the integrated circuit package system 1200 can be formed in a different configuration, such as rectangular.

Figure 13:
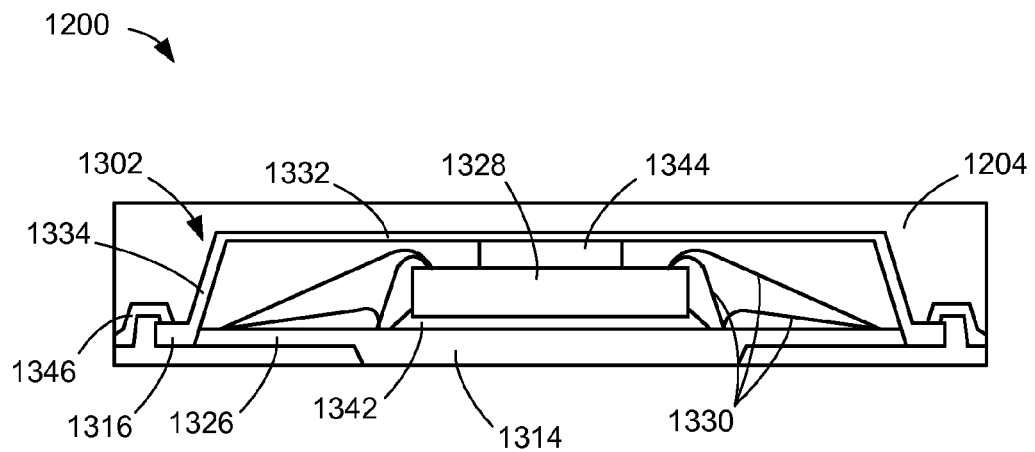
FIG. 13 is a cross-sectional view of the integrated circuit package system along line 13-13 of FIG. 12.

Referring now to FIG. 13, therein is shown a cross-sectional view of the integrated circuit package system 1200 along line 13-13 of FIG. 12. The integrated circuit package system 1200 includes structural similarities with the integrated circuit package system 100 of FIG. 1. The cross-sectional view depicts an integrated circuit 1328, such as an integrated circuit die, mounted over a paddle 1314, such as a die-attach paddle, with an adhesive 1342, such as a die-attach adhesive. Tie bars 1326 can extend from the paddle 1314.

Internal interconnects 1330, such as bond wires or ribbon bond wires, can connect the integrated circuit 1328 with the tie bars 1326, similarly shown in FIG. 1, or a combination thereof. A spacer 1344, such as an adhesive spacer or a film adhesive, is between the integrated circuit 1328 and a shield 1302. The spacer 1344 can function to provide clearance for the wire loops of the internal interconnects 1330 from the shield 1302 preventing damage to the internal interconnects 1330. The shield 1302 is mounted into the tie bars 1326 and over the spacer 1344, the integrated circuit 1328, and the internal interconnects 1330.

The shield 1302 includes a central portion 1332 and supports 1334 extending from the central portion 1332. The supports 1334 include shield bases 1316 adjacent and pressed towards the tie bars 1326. An interlock 1346 can press the supports 1334 to the tie bars 1326. The interlock 1346 includes resilient spring like properties to press the supports 1334 towards the tie bars 1326. The tie bars 1326 include planar rigidity to withstand the pressing force from the interlock 1346 and the supports.

The encapsulation 1204 can be over the integrated circuit 1328, the internal interconnects 1330, the interlock 1346, and the shield 1302. The semi-loop configuration of the interlock 1346 can function as a mold interlock feature. The encapsulation 1204 can also provide the counter force to the interlock 1346 as the interlock presses the supports 1334. The encapsulation 1204 exposes the paddle 1314. For illustrative purposes, the integrated circuit package system 1200 is shown with the paddle 1314 exposed from the encapsulation 1204, although it is understood that the encapsulation 1204 may not expose the paddle 1314.

Figure 14:
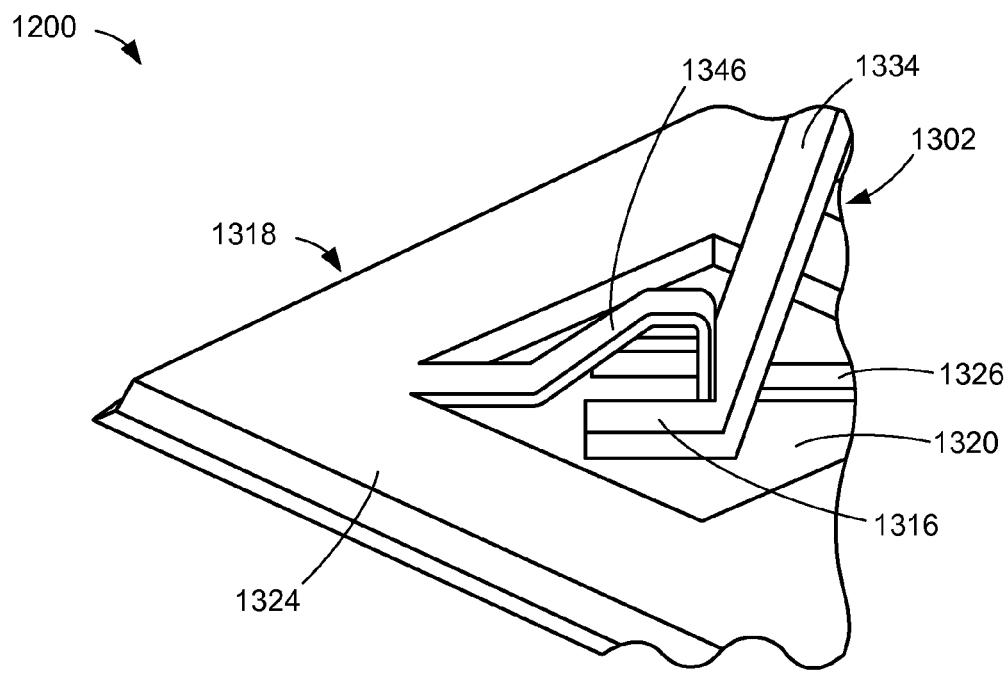
FIG. 14 is a detailed isometric view of a portion of the integrated circuit package system of FIG. 13 in a mounting step of the shield.

Referring now to FIG. 14, therein is shown a detailed isometric view of a portion of the integrated circuit package system 1200 of FIG. 13 in a mounting step of the shield 1302. The detailed isometric view depicts a corner portion of a lead frame 1318 depicting one of the tie bars 1326 between the paddle 1314 of FIG. 13 and dam bars 1324. One of the supports 1334 is shown over a tape 1320, which is optional.

The interlock 1346 is shown between the shield bases 1316 pressing the supports towards the tie bars 1326. The interlock 1346 can snap into the shield bases 1316, as an example. The shield bases 1316, the supports 1334, or a combination thereof can contact the tie bars 1326. If the tie bars 1326 are grounded, then the shield 1302 is also ground such that the shield 1302 can function as an EMI shield. The interlock 1346 can be formed with a raised portion that has been separated from the tie bars 1326.

Figure 15:
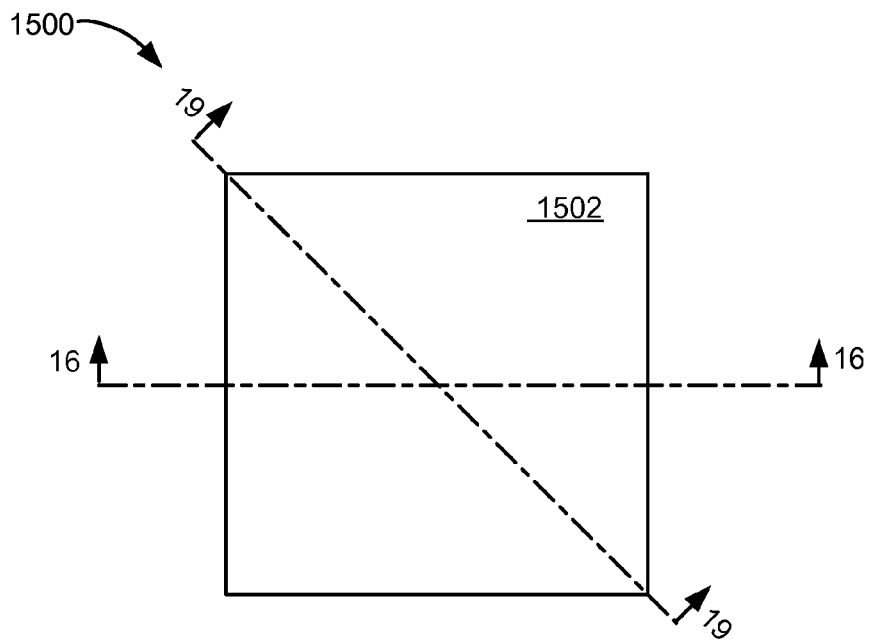
FIG. 15 is a top view of an integrated circuit package system in a fifth embodiment of the present invention.

Referring now to FIG. 15, therein is shown a top view of an integrated circuit package system 1500 in a fifth embodiment of the present invention. The top view depicts an encapsulation 1502, such as a cover including an epoxy molding compound. For illustrative purposes, the integrated circuit package system 1500 is shown with a square configuration, although it is understood that the integrated circuit package system 1500 can be formed in a different configuration, such as rectangular.

Figure 16:
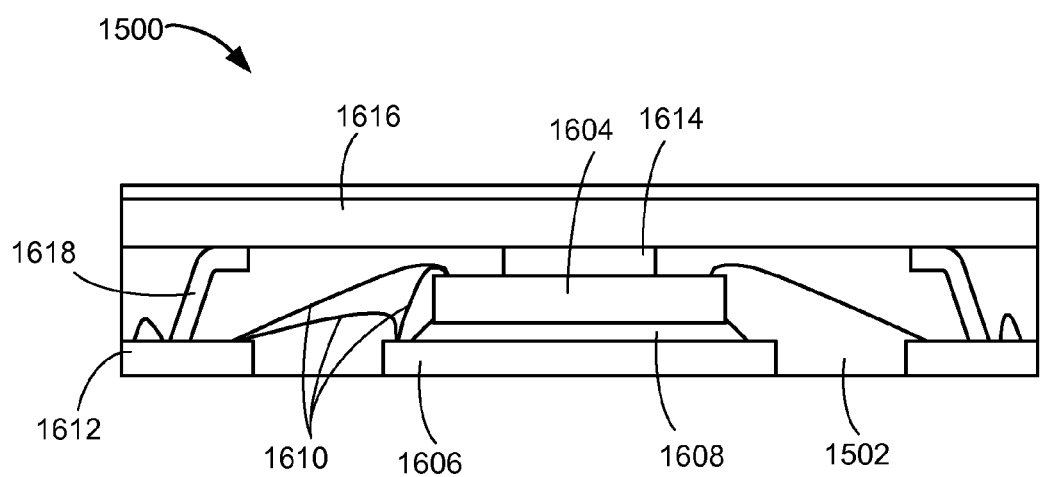
FIG. 16 is a cross-sectional view of the integrated circuit package system along line 16-16 of FIG. 15.

Referring now to FIG. 16, therein is shown a cross-sectional view of the integrated circuit package system 1500 along line 16-16 of FIG. 15. The cross-sectional view depicts an integrated circuit 1604, such as an integrated circuit die, mounted over a paddle 1606, such as a die-attach paddle, with an adhesive 1608, such as a die-attach adhesive.

Internal interconnects 1610, such as bond wires or ribbon bond wires, can connect the integrated circuit 1604 with leads 1612. A spacer 1614, such as an adhesive spacer or a film adhesive, is between the integrated circuit 1604 and a shield 1616. The spacer 1614 can function to provide clearance for the wire loops of the internal interconnects 1610 from the shield 1616 preventing damage to the internal interconnects 1610. The spacer 1614 can also function to hold the shield 1616 in place. Support structures 1618, such as raised fused leads, adjacent to the leads 1612 also support the shield 1616. The support structures 1618 include resilient spring like properties ensuring contact with the shield 1616.

The encapsulation 1502 can be over the integrated circuit 1604, the internal interconnects 1610, and the shield 1616. The encapsulation 1502 exposes the paddle 1606 and the leads 1612. For illustrative purposes, the integrated circuit package system 1500 is shown with the paddle 1606 exposed from the encapsulation 1502, although it is understood that the encapsulation 1502 may not expose the paddle 1606. Also for illustrative purposes, the integrated circuit package system 1500 is shown with the encapsulation 1502 covering the horizontal portion of the shield 1616, although it is understood that the integrated circuit package system 1500 can have a different configuration, such as the encapsulation 1502 exposing the horizontal portion of the shield 1616.

Figure 17:
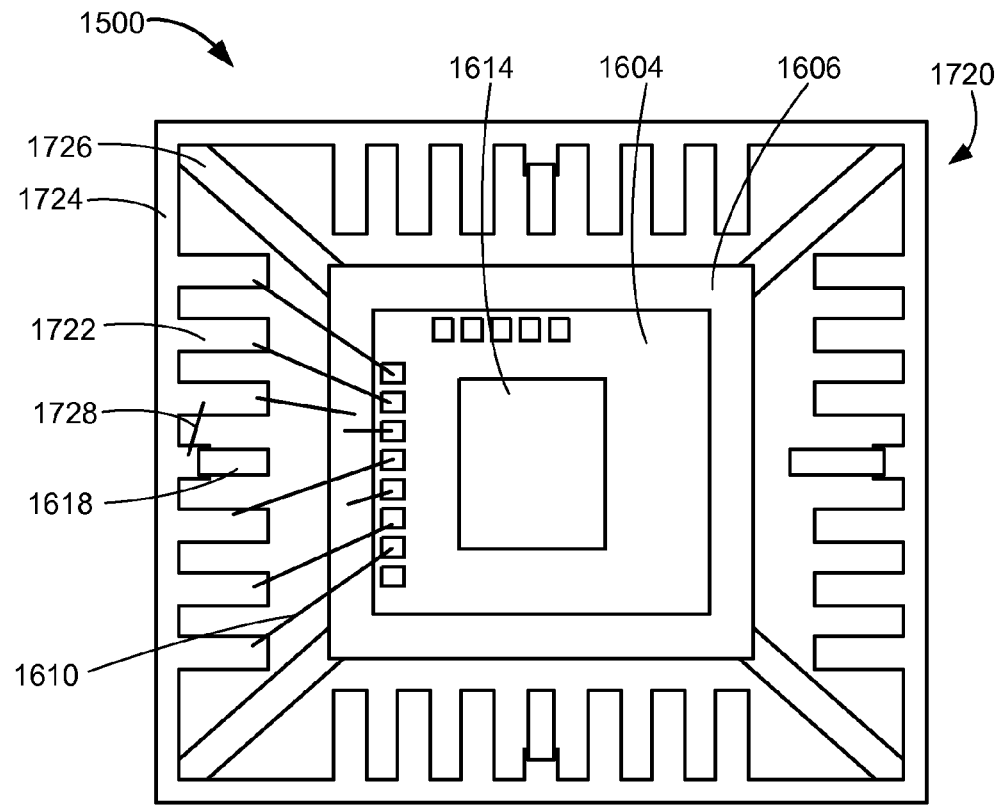
FIG. 17 is a top view of the integrated circuit package system of FIG. 16 in a connecting step of the internal interconnects.

Referring now to FIG. 17, therein is shown a top view of the integrated circuit package system 1500 of FIG. 16 in a connecting step of the internal interconnects 1610. The top view depicts a lead frame 1720. Side terminals 1722 can extend from dam bars 1724 of the lead frame 1720 and towards the paddle 1606. The support structures 1618 are adjacent to the side terminals 1722 and also extend from the dam bars 1724. Tie bars 1726 can be between the corners of the lead frame 1720 and the paddle 1606.

The integrated circuit 1604 mounts over the paddle 1606 and the spacer 1614 over the integrated circuit 1604. The internal interconnects 1610 can connect the integrated circuit 1604 and a predetermined selection of the side terminals 1722 as well as to the paddle 1606. For clarity, not all the internal interconnects 1610 are depicted. Shielding interconnects 1728, such as bond wires, can connect a predetermined selection of the side terminals 1722 with the support structures 1618. The side terminals 1722 form the leads 1612 of FIG. 16 from the processing of the lead frame 1720.

Figure 18:
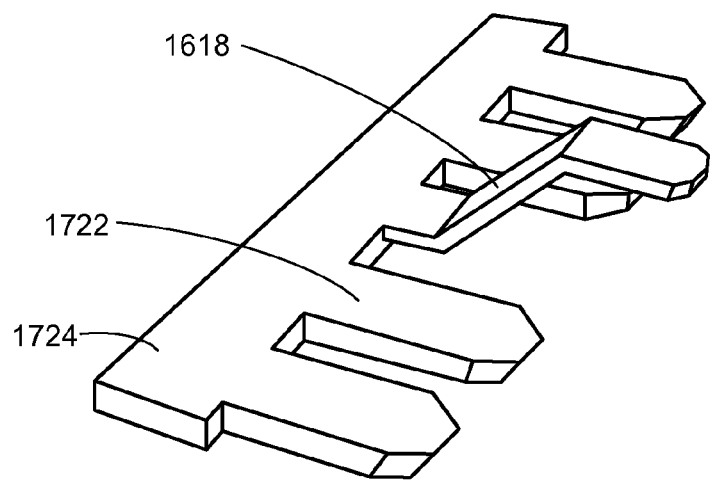
FIG. 18 is an isometric view of a portion of the structure of FIG. 17.

Referring now to FIG. 18, therein is shown an isometric view of a portion of the structure of FIG. 17. The isometric view depicts the side terminals 1722 and the support structures 1618 both extending from the dam bars 1724. As in this example, the support structures 1618 are adjacent to the side terminals 1722.

The support structures 1618 can be formed with different processes. The support structures 1618 can be formed from a predetermined selection of the side terminals 1722. The predetermined selection of the side terminals 1722 may be formed through a punch process or a press process.

Figure 19:
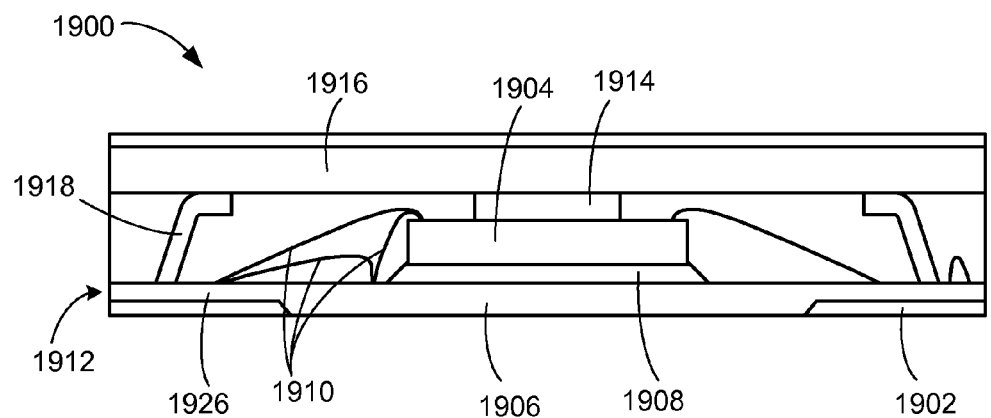
FIG. 19 is a cross-sectional view of an integrated circuit package system as exemplified by the top view of FIG. 15 along line 19-19 of FIG. 15 in a sixth embodiment of the present invention.

Referring now to FIG. 19, therein is shown a cross-sectional view of an integrated circuit package system 1900 as exemplified by the top view of FIG. 15 along line 19-19 of FIG. 15 in a sixth embodiment of the present invention. The cross-sectional view depicts an integrated circuit 1904, such as an integrated circuit die, mounted over a paddle 1906, such as a die-attach paddle, with an adhesive 1908, such as a die-attach adhesive. Tie bars 1926 can extend from the paddle 1906.

Internal interconnects 1910, such as bond wires or ribbon bond wires, can connect the integrated circuit 1904 with leads 1912. A spacer 1914, such as an adhesive spacer or a film adhesive, is between the integrated circuit 1904 and a shield 1916. The spacer 1914 can function to provide clearance for the wire loops of the internal interconnects 1910 from the shield 1916 preventing damage to the internal interconnects 1910. The spacer 1914 can also function to hold the shield 1916 in place. Support structures 1918, such as raised split tie bars, also support the shield 1916. The support structures 1918 include resilient spring like properties ensuring contact with the shield 1916.

An encapsulation 1902 can be over the integrated circuit 1904, the internal interconnects 1910, and the shield 1916. The encapsulation 1902 exposes the paddle 1906 and the leads 1912. For illustrative purposes, the integrated circuit package system 1900 is shown with the paddle 1906 exposed from the encapsulation 1902, although it is understood that the encapsulation 1902 may not expose the paddle 1906. Also for illustrative purposes, the integrated circuit package system 1900 is shown with the encapsulation 1902 covering the horizontal portion of the shield, although it is understood that the integrated circuit package system 1900 can have a different configuration, such as the encapsulation 1902 exposing the horizontal portion of the shield.

Figure 20:
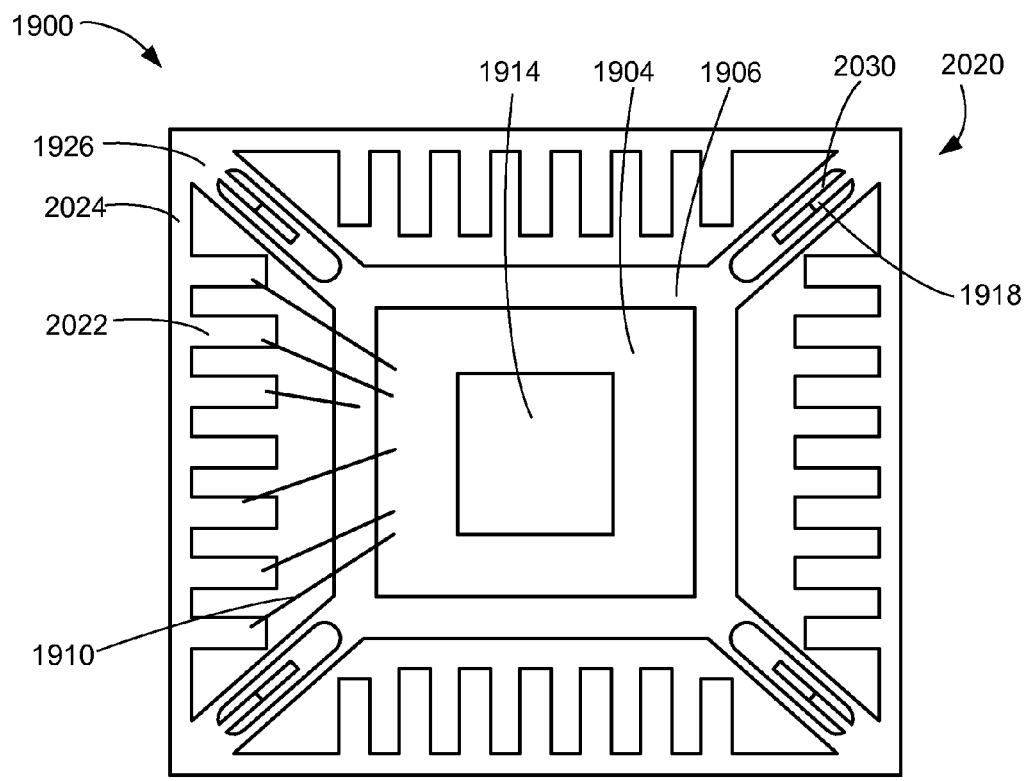
FIG. 20 is a top view of the integrated circuit package system of FIG. 19 in a connecting step of the internal interconnects.

Referring now to FIG. 20, therein is shown a top view of the integrated circuit package system 1900 of FIG. 19 in a connecting step of the internal interconnects 1910. The top view depicts a lead frame 2020. Side terminals 2022 can extend from dam bars 2024 of the lead frame 2020 and towards the paddle 1906. The tie bars 1926 can be between the corners of the lead frame 2020 and the paddle 1906. Each of the tie bars 1926 can include a slot 2030 with the support structures 1918 over the slot 2030.

The integrated circuit 1904 mounts over the paddle 1906 and the spacer 1914 over the integrated circuit 1904. The internal interconnects 1910 can connect the integrated circuit 1904 and a predetermined selection of the side terminals 2022. For clarity, not all the internal interconnects 1910 are depicted. The side terminals 2022 form the leads 1912 of FIG. 19 from the processing of the lead frame 2020

Figure 21:
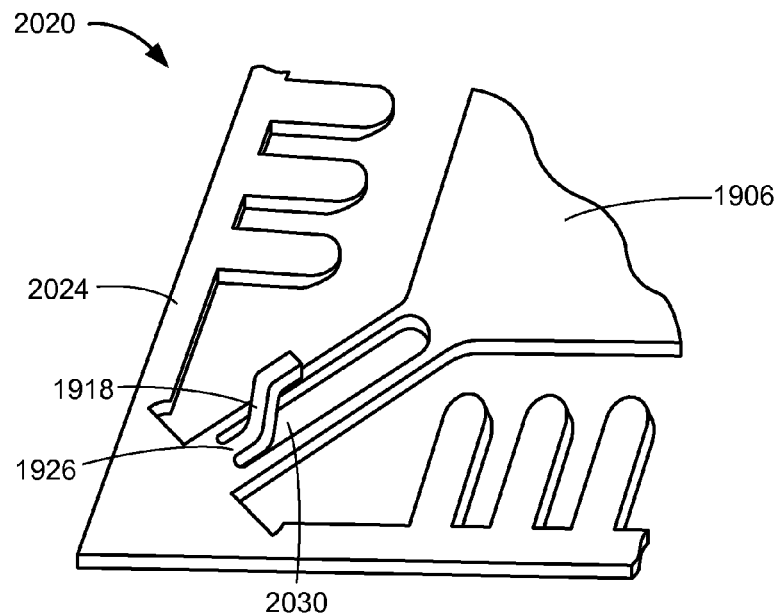
FIG. 21 is an isometric view of a portion of the structure of FIG. 20.

Referring now to FIG. 21, therein is shown an isometric view of a portion of the structure of FIG. 20. The isometric view depicts a corner portion of the lead frame 2020 depicting one of the tie bars 1926 between the paddle 1906 and the dam bars 2024. One of the support structures 1918 is shown elevated over the tie bars 1926.

The support structures 1918 are shown extending from the corner portion of the tie bars 1926 away from the paddle 1906. The support structures 1918 can also extend from the side of the slot 2030 adjacent to the paddle 1906. Also, the support structures 1918 can extend from both sides of the slot 2030. If the tie bars 1926 are grounded, then the shield 1916 of FIG. 19 is also grounded through the support structures 1918 such that the shield 1916 can function as an EMI shield.

Figure 22:
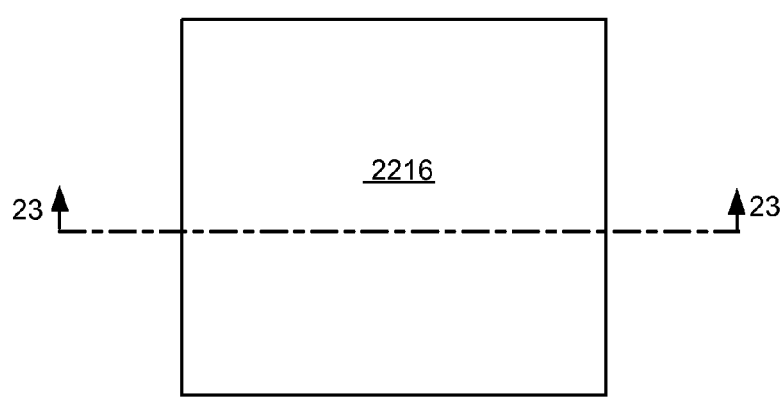
FIG. 22 is a top view of an integrated circuit package system in a seventh embodiment of the present invention.

Referring now to FIG. 22, therein is shown a top view of an integrated circuit package system 2200 in a seventh embodiment of the present invention. The top view depicts a shield 2216, such as a conductive shield including aluminized die, copper plate, or heat sink material. For illustrative purposes, the integrated circuit package system 2200 is shown with a square configuration, although it is understood that the integrated circuit package system 2200 can be formed in a different configuration, such as rectangular.

Figure 23:
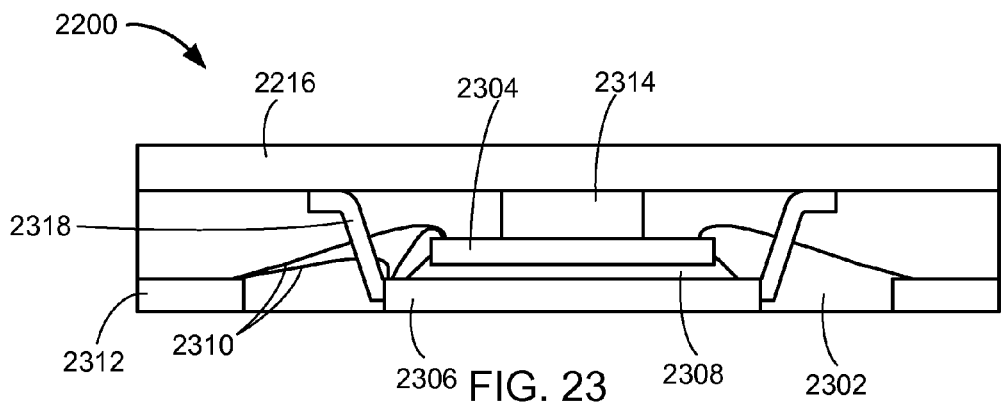
FIG. 23 is a cross-sectional view of the integrated circuit package system along line 23-23 of FIG. 22.

Referring now to FIG. 23, therein is shown a cross-sectional view of the integrated circuit package system 2200 along line 23-23 of FIG. 22. The cross-sectional view depicts an integrated circuit 2304, such as an integrated circuit die, mounted over a paddle 2306, such as a die-attach paddle, with an adhesive 2308, such as a die-attach adhesive.

Internal interconnects 2310, such as bond wires or ribbon bond wires, can connect the integrated circuit 2304 with leads 2312. A spacer 2314, such as an adhesive spacer or a film adhesive, is between the integrated circuit 2304 and the shield 2216. The spacer 2314 can function to provide clearance for the wire loops of the internal interconnects 2310 from the shield 2216 preventing damage to the internal interconnects 2310. The spacer 2314 can also function to hold the shield 2216 in place. Support structures 2318, such as raised paddle extensions, can extend from the paddle 2306 also support the shield 2216. The support structures 2318 include resilient spring like properties ensuring contact with the shield 2216.

An encapsulation 2302 can be over the integrated circuit 2304 and the internal interconnects 2310. The encapsulation 2302 exposes the paddle 2306 and the leads 2312. For illustrative purposes, the integrated circuit package system 2200 is shown with the paddle 2306 exposed from the encapsulation 2302, although it is understood that the encapsulation 2302 may not expose the paddle 2306. Also for illustrative purposes, the integrated circuit package system 2200 is shown with the encapsulation 2302 exposing the horizontal portion of the shield 2216, although it is understood that the integrated circuit package system 2200 can have a different configuration, such as the encapsulation 2302 covering the horizontal portion of the shield 2216.

Figure 24:
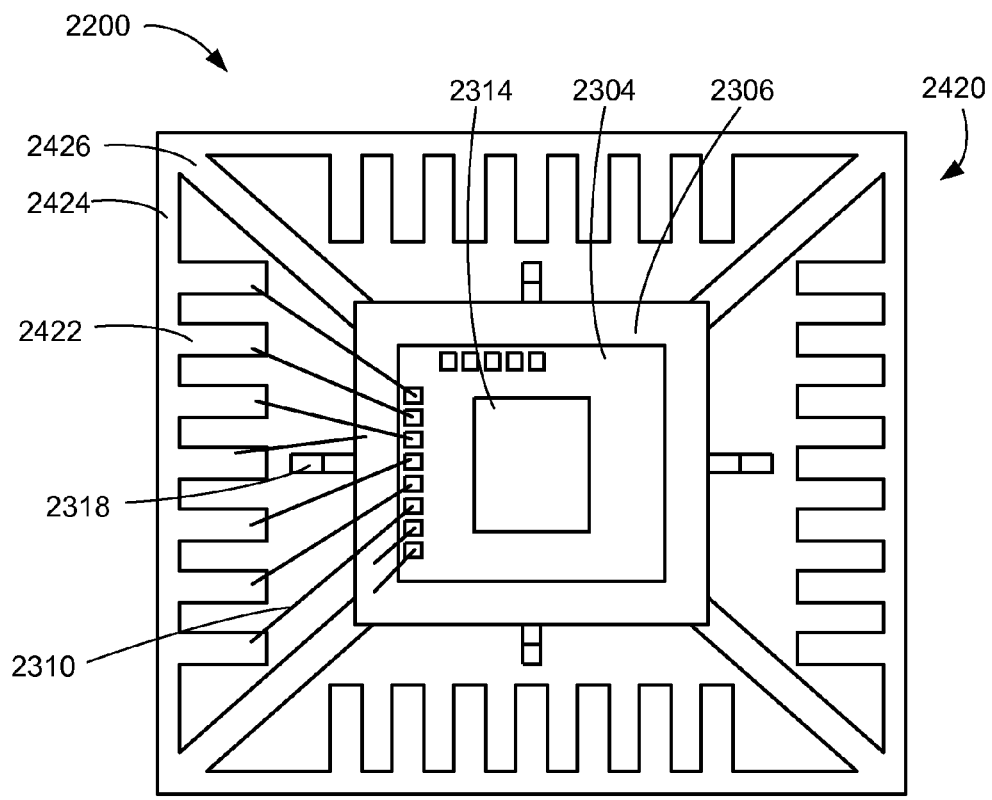
FIG. 24 is a top view of the integrated circuit package system of FIG. 23 in a connecting step of the internal interconnects.

Referring now to FIG. 24, therein is shown a top view of the integrated circuit package system 2200 of FIG. 23 in a connecting step of the internal interconnects 2310. The top view depicts a lead frame 2420. Side terminals 2422 can extend from dam bars 2424 of the lead frame 2420 and towards the paddle 2306. The support structures 2318 can extend from the paddle 2306. Tie bars 2426 can be between the corners of the lead frame 2420 and the paddle 2306.

The integrated circuit 2304 mounts over the paddle 2306 and the spacer 2314 over the integrated circuit 2304. The internal interconnects 2310 can connect the integrated circuit 2304 with a predetermined selection of the side terminals 2422, the integrated circuit 2304 with the paddle 2306, and the paddle 2306 with a predetermined selection of the side terminals 2422. For clarity, not all the internal interconnects 2310 are depicted. The side terminals 2422 form the leads 2312 of FIG. 23 from the processing of the lead frame 2420.

Figure 25:
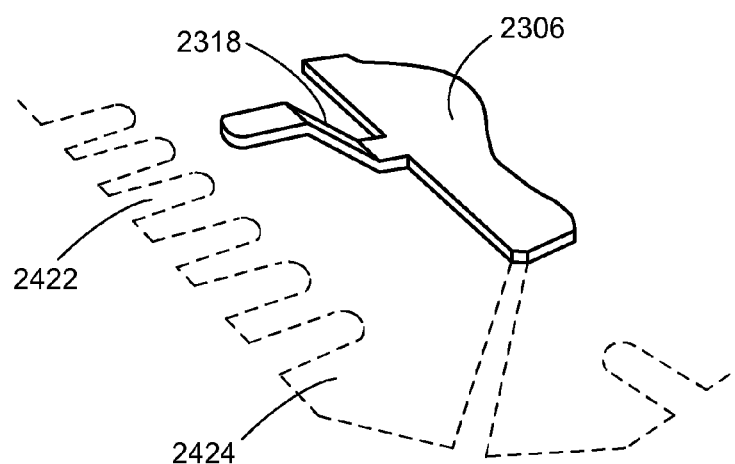
FIG. 25 is an isometric view of a portion of the structure of FIG. 24.

Referring now to FIG. 25, therein is shown an isometric view of a portion of the structure of FIG. 24. The isometric view depicts the side terminals 2422 extending from the dam bars 2424 and the support structures 2318 extending from the paddle 2306. The support structures 2318 can be formed with different processes. The support structures 2318 can be formed from extensions from the paddle 2306. The support structures 2318 may be formed with the extensions undergoing through a punch process or a press process.

Figure 26:
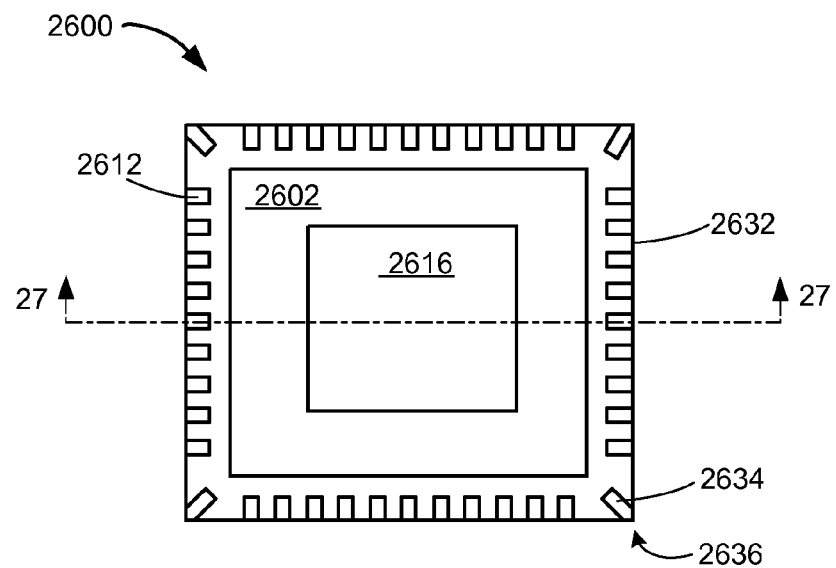
FIG. 26 is a top view of an integrated circuit package system in an eighth embodiment of the present invention.

Referring now to FIG. 26, therein is shown a top view of an integrated circuit package system 2600 in an eighth embodiment of the present invention. The top view depicts a shield 2616, such as an electromagnetic interference (EMI) shield, surrounded by an encapsulation 2602, such as a cover including an epoxy molding compound. Leads 2612 can be exposed from the encapsulation 2602 at sides 2632 of the integrated circuit package system 2600. Corner terminals 2634, such as leads, can be exposed from the encapsulation 2602 at corners 2636 of the integrated circuit package system 2600.

For illustrative purposes, the integrated circuit package system 2600 are shown with the leads 2612 equally distributed along each of the sides 2632, although it is understood that the integrated circuit package system 2600 can have the leads 2612 in a different configuration. For example, the number of the leads 2612 can be different between the sides 2632 of the integrated circuit package system 2600.

Also for illustrative purposes, the integrated circuit package system 2600 is shown with the corner terminals 2634 along each of the corners 2636, although it is understood that the integrated circuit package system 2600 can have the corner terminals 2634 in a different configuration. For example, the number of the corner terminals 2634 may not populate each of the corners 2636 of the integrated circuit package system 2600.

Further for illustrative purposes, the integrated circuit package system 2600 is shown with the shield 2616 exposed by the encapsulation 2602, although it is understood that the integrated circuit package system 2600 can have the shield in a different configuration. For example, the integrated circuit package system 2600 may not expose the shield 2616 from the encapsulation 2602.

Figure 27:
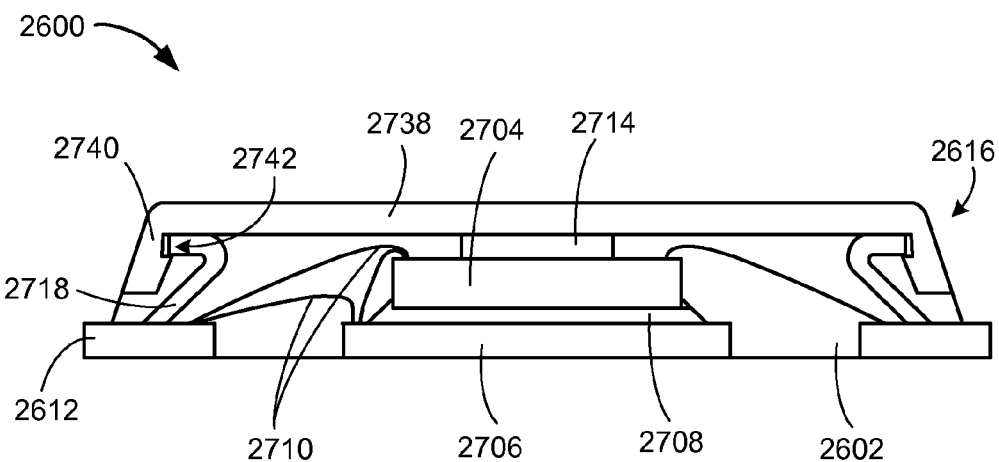
FIG. 27 is a cross-sectional view of the integrated circuit package system along line 27-27 of FIG. 26.

Referring now to FIG. 27, therein is shown a cross-sectional view of the integrated circuit package system 2600 along line 27-27 of FIG. 26. The cross-sectional view depicts an integrated circuit 2704, such as an integrated circuit die, mounted over a paddle 2706, such as a die-attach paddle, with an adhesive 2708, such as a die-attach adhesive.

Internal interconnects 2710, such as bond wires or ribbon bond wires, can connect the integrated circuit 2704 with the leads 2612. A spacer 2714, such as an adhesive spacer or a film adhesive, is between the integrated circuit 2704 and the shield 2616. The spacer 2714 can function to provide clearance for the wire loops of the internal interconnects 2710 from the shield 2616 preventing damage to the internal interconnects 2710. The spacer 2714 can also function to hold the shield 2616 in place. Support structures 2718, such as raised fused leads, adjacent to the leads 2612 also support and lock the shield 2616 in place. The support structures 2718 include resilient spring like properties ensuring contact with the shield 2616.

The shield 2616, such as a snap cap type shield, includes a central portion 2738 and a locking portion 2740 extending from the central portion 2738. For example, the central portion 2738 is shown as planar and horizontal. The locking portion 2740 is shown as non-horizontal. The locking portion 2740 includes an indent 2742 at the junction between the central portion 2738 and the locking portion 2740. The indent 2742 may be formed in a number of different configurations. For example, the indent 2742 can be formed as a localized groove, a ring along the inner perimeter of the shield, a slot, or a hole. The support structures 2718 can be formed with a resilient spring back property such that the support structures 2718 will lock into the indent 2742.

The encapsulation 2602 can be over the integrated circuit 2704 and the internal interconnects 2710. The shield 2616 can be over the top portion of the encapsulation 2602. The encapsulation 2602 exposes the paddle 2706 and the leads 2612. For illustrative purposes, the integrated circuit package system 2600 is shown with the paddle 2706 exposed from the encapsulation 2602, although it is understood that the encapsulation 2602 may not expose the paddle 2706. Also for illustrative purposes, the integrated circuit package system 2600 is shown with the encapsulation 2602 covered by the shield 2616, although it is understood that the integrated circuit package system 2600 can have a different configuration, such as the encapsulation 2602 covering the shield 2616.

Figure 28:
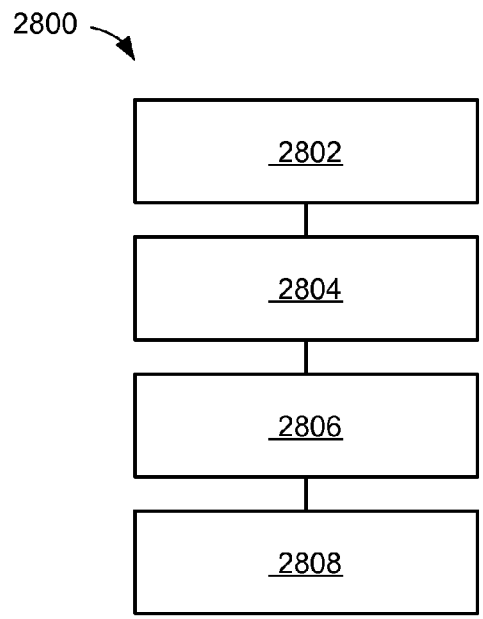
FIG. 28 is a flow chart of an integrated circuit package system for manufacture of the integrated circuit package system in an embodiment of the present invention.

Referring now to FIG. 28, therein is shown a flow chart of an integrated circuit package system 2800 for manufacture of the integrated circuit package system 100 in an embodiment of the present invention. The system 2800 includes providing a tie bar and a lead adjacent thereto in a block 2802; connecting an integrated circuit and the lead in a block 2804; mounting a shield over the integrated circuit with the shield connected to the tie bar in a block 2806; and encapsulating the integrated circuit and the shield in a block 2808.

Figure 29:
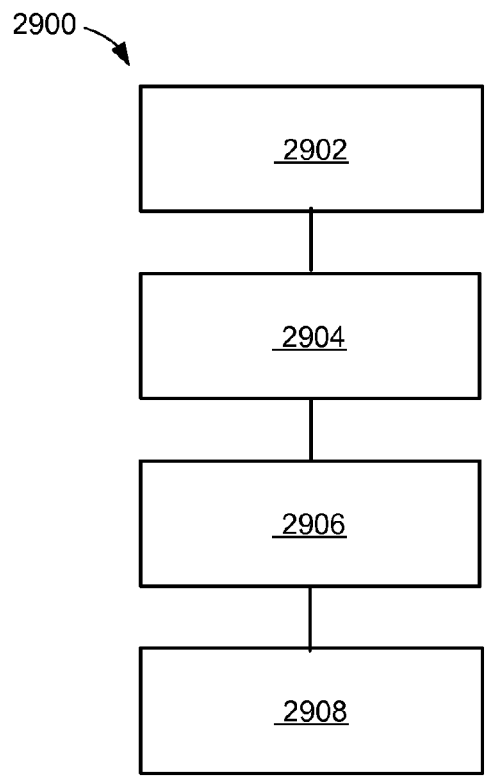
FIG. 29 is a flow chart of an integrated circuit package system for manufacture of the integrated circuit package system in an embodiment of the present invention.

Referring now to FIG. 29, therein is shown a flow chart of an integrated circuit package system 2900 for manufacture of the integrated circuit package system 1500 in an embodiment of the present invention. The system 2900 includes forming a lead and a support structure with substantially the same material as the lead and elevated above the lead in a block 2902; connecting an integrated circuit and the lead in a block 2904; mounting a shield over the integrated circuit with the shield on the support structure in a block 2906; and encapsulating the integrated circuit and the shield in a block 2908.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a tie bar; and
   providing a lead adjacent to the tie bar;
   connecting an integrated circuit and the lead;
   mounting a shield, having a shield base which is horizontal, over the integrated circuit with the shield connected to the tie bar, and with a bottom surface of the shield base coplanar with a bottom surface of the lead; and
   encapsulating the integrated circuit and the shield.

2. The method as claimed in claim 1 wherein mounting the shield includes mounting the shield base with the tie bar in between.

3. The method as claimed in claim 1 wherein:
   providing the tie bar includes the tie bar having a slot; and
   mounting the shield includes mounting the shield base within the slot of the tie bar.

4. The method as claimed in claim 1 wherein mounting the shield over the integrated circuit with the shield connected to the tie bar includes fitting the shield base with the tie bar.

5. The method as claimed in claim 1 wherein mounting the shield over the integrated circuit with the shield connected to the tie bar includes pressing an interlock to the shield towards the tie bar.

6. A method for manufacturing an integrated circuit package system comprising:
   providing a tie bar extending from a paddle;
   providing a lead adjacent to the tie bar;
   connecting an integrated circuit over the paddle and to the lead;
   mounting a shield, having a shield base which is horizontal, over the integrated circuit with the shield connected to the tie bar, and with a bottom surface of the shield base coplanar with a bottom surface of the lead;
   encapsulating the integrated circuit and the shield; and
   grounding the shield.

7. The method as claimed in claim 6 wherein:
   encapsulating the shield includes exposing the shield base of the shield; and
   grounding the shield includes grounding the shield base.

8. The method as claimed in claim 6 wherein mounting the shield over the integrated circuit with the shield connected to the tie bar includes connecting a shield interconnect between the shield and the tie bar.

9. The method as claimed in claim 6 wherein mounting the shield over the integrated circuit with the shield connected to the tie bar includes a support of the shield having a tapered configuration and the support is wedged into a slot in the tie bar.

10. The method as claimed in claim 6 wherein mounting the shield includes mounting the shield base of the shield with the shield base having a coating.

11. An integrated circuit package system comprising:
    a tie bar and a lead adjacent thereto;
    an integrated circuit connected with the lead;
    a shield over the integrated circuit with the shield connected to the tie bar;
    a shield base, which is horizontal, connected to the tie bar and the shield, with a bottom surface of the shield base coplanar with a bottom surface of the lead; and
    an encapsulation over the integrated circuit and at least a portion of the shield.

12. The system as claimed in claim 11 wherein:
    the tie bar is between the shield base.

13. The system as claimed in claim 11 wherein:
    the tie bar includes a slot; and
    the shield includes the shield base within the slot of the tie bar.

14. The system as claimed in claim 11 wherein:
    the shield base is fitted to the tie bar.

15. The system as claimed in claim 11 further comprising an interlock pressed to the shield towards the tie bar.

16. The system as claimed in claim 11 wherein:
    the tie bar extends from the paddle;
    the integrated circuit is over the paddle; and
    the shield is grounded.

17. The system as claimed in claim 16 wherein:
    the encapsulation exposes the shield base of the shield; and
    the shield is grounded through the shield base.

18. The system as claimed in claim 16 further comprising a shield interconnect between the shield and the tie bar.

19. The system as claimed in claim 16 wherein:
    the shield includes a support having a tapered configuration; and
    the support is wedged into a slot in the tie bar.

20. The system as claimed in claim 16 wherein the shield includes the shield base having a coating.

* * * * *